United States Patent

[11] 3,600,696

[72] Inventor Paul E. Grandmont
Bloomfield, N.J.
[21] Appl. No. 848,520
[22] Filed Aug. 8, 1969
[45] Patented Aug. 17, 1971
[73] Assignee Singer-General Precision, Inc.
Little Falls, N.J.

[54] COMPLEMENTARY PAIRED TRANSISTOR CIRCUIT ARRANGEMENTS
3 Claims, 8 Drawing Figs.

[52] U.S. Cl. .......... 330/13, 307/313, 330/28, 330/151
[51] Int. Cl. .......... H03f 3/18
[50] Field of Search .......... 330/13, 17, 11 P, 15, 149, 151; 307/313, 255

[56] References Cited

UNITED STATES PATENTS 3,441,864 4/1969 Hafler .......... 330/13 X
3,469,202 9/1969 Priddy .......... 330/151 X

OTHER REFERENCES

Chidester, " Complementary Dual-Follower Increases Input Impedance," Electronic Design, Nov. 8, 1965, pp. 58, 59, 330-17

*Primary Examiner*—Roy Lake
*Assistant Examiner*—James B. Mullins
*Attorneys*—S. A. Giarratana and S. M. Bender

ABSTRACT: An electrical circuit is provided comprising a pair of complementary transistors arranged as emitter followers, said transistors having their base-emitter circuits connected in parallel with each other and in series with a load resistor respectively. An impedance network is connected in parallel across the two base-emitter paths for biasing either one or the other transistor into conduction depending upon the polarity of the input signal. For low signal levels below the "diode drop" level of each transistor's base-emitter junction, the impedance network directly couples the network to the load resistor.

PRIOR ART

INVENTOR.
PAUL E. GRANDMONT
BY GIARRATANA & BENDER
ATTORNEY

INVENTOR.
PAUL E. GRANDMONT
BY GIARRATANA & BENDER
ATTORNEY

COMPLEMENTARY PAIRED TRANSISTOR CIRCUIT ARRANGEMENTS

BRIEF SUMMARY OF THE INVENTION

The present invention relates generally to electrical transistor circuit arrangements, and more particularly, to an arrangement for eliminating "crossover distortion" in so-called complementary paired transistor amplifier circuits.

Complementary transistor circuits are known wherein a PNP transistor and an NPN transistor are arranged as a pair of emitter followers for delivering amplified current through a load. One problem often encountered with these circuits is that they suffer from a form of distortion called "crossover" distortion. What happens is that the amplifier stage has no output when the input signal is less than the basic "diode drop" across the respective base-emitter junctions in each transistor. By way of example, the back bias across the base-emitter junction of a typical germanium transistor is roughly 0.3 volts whereas, for silicon transistors, this value may approach roughly 0.7 volts. Thus, for input signals in the range less than the values given respectively, the complementary paired amplifier stage has zero output. Above these levels, depending upon the polarity of the input signals, either one or the other transistor is driven into conduction via base current flow and an amplified current is delivered into the load. It may thus be seen that for varying signal inputs, the complementary paired stage will conduct amplified current through the load only when the signal magnitude exceeds the base emitter-junction threshold for each transistor, but will not conduct when the input signal is "crossing-over" in the range where conduction is transferred from one transistor to another.

Various biasing schemes have been proposed in the past to overcome this form of "crossover" distortion typically by applying a voltage to the base of each transistor suitable to overcome the latter's base-emitter "diode drop" or threshold voltage. However, in each of these known methods either a plurality of resistors, or a combination of resistors and diodes is used to cause a small bias current to flow into the base of one transistor and out through the base of the other transistor. This, in turn, causes a quiescent current to flow from a positive voltage supply line to a negative voltage supply line through the collector-emitter paths common to the complementary pair. In the event of any changes in the bias current brought about, say, by thermal instability, the quiescent current will rise tending to increase transistor dissipation and possibly causing the transistor stage to run away due to "thermal feedback." Even when a pair of diodes is used in the biasing circuit so that the voltage drops across the diodes will tend to track the base-emitter voltages in each transistor and thereby show greater thermal stability, care is still required in this respect, and the circuit suffers the additional disadvantage of having a relatively higher cost due to the use of the discrete diode components. Moreover, in the case where diodes are used in the biasing circuit, the ability to feed base current to each transistor severely degrades at high output levels.

Against this background, it is the primary object of the present invention to provide a complementary paired transistor amplifying circuit having a simplified biasing arrangement which substantially reduces "crossover" distortion and at the same time renders the circuit thermally stable.

Briefly described the circuit of the present invention contemplates the use of an impedance means or network connected in parallel between the common base input junction and the common emitter junction of a complementary paired, emitter follower transistor amplifying circuit. The impedance which is in series with the stage's load resistor thus forms a voltage divider which is effective to eliminate the "zero-gain" region present at low input signal levels.

These and other objects and advantages will become more apparent from a study of the following detailed description of the invention in connection with the accompanying drawings wherein like reference numerals refer to like parts throughout the several figures.

DETAILED DESCRIPTION OF THE INVENTION

Figure 1:
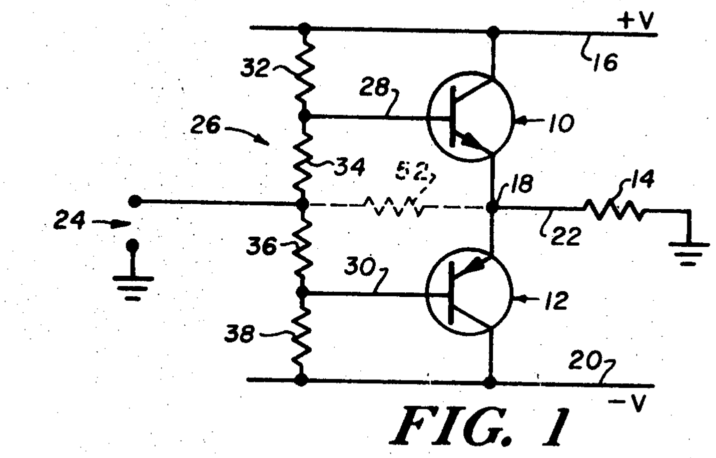
PRIOR ART FIG. 1
FIG. 1 is a schematic circuit diagram showing a prior art transistor circuit arrangement.

Turning now to FIG. 1, there is shown a typical prior art electrical circuit arrangement comprising a complementary pair of transistors 10 and 12 connected as emitter followers for delivering amplified current through a load resistor 14. Transistor 10 which is of the NPN type, has its collector terminal connected to a positive voltage bus 16 and has its emitter terminal connected to a common junction 18. Transistor 12, which is a PNP type transistor, also has its emitter terminal connected to common junction 18 and has its collector terminal connected to a negative voltage supply line 20. A conductor 22 leads from the common emitter junction between the transistors to the load resistor 14.

An input terminal 24 is connected through a voltage divider or biasing circuit represented generally by reference numeral 26 to a branched pair of conductors 28 and 30 which, in turn, are connected respectively to each base of transistors 10 and 12. Biasing circuit 26 includes a first resistor 32 connected between the positive voltage bus 16 and base conductor 28, a second resistor 34 connected between conductor 28 and input terminal 24, a third resistor 36 coupled between input conductor 24 and base conductor 30, and a fourth resistor 38 connected between base conductor 30 and the negative voltage supply line 20.

Figure 2A:
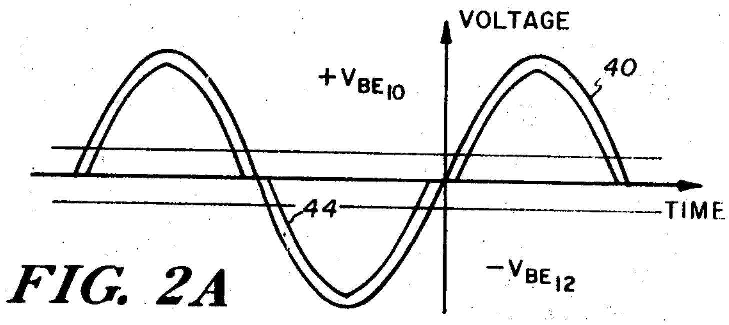
FIGS. 2A and 2B are voltage-time graphs illustrating the operation of the prior art circuit and the circuit according to the present invention respectively.

For the moment, let it be assumed that biasing resistors 32 and 38 are open circuited while resistors 34 and 36 are short circuited and a sinusoidally varying input signal is impressed upon input terminals 24 as indicated; for example, by waveform 40 in FIG. 2A, As the voltage input waveform 40 begins to increase in magnitude during its positive half cycle, a positive potential will be applied to the base transistor 10. The transistor 10, however, will remain cut off or nonconducting until the "diode drop" or threshold voltage $+V_{BE_{10}}$ across its base-emitter junction is overcome by the input signal. That is, there will be no output voltage developed across load resistor 14 and therefore no current flowing through this resistor until the input signal 40 reaches a predetermined magnitude whereupon transistor 10 is driven into conduction. Only then will the output voltage across resistor 14 begin to rise as indicted by curve 44. Now as the positive half cycle of the input signal waveform starts to go less positive after passing through its maximum the reverse takes place with transistor 10 cutting off as the potential across its base-emitter junction falls below the "diode drop" value $+V_{BE_{10}}$, whereupon the output voltage across resistor 14 suddenly drops to zero.

Even as the input signal 40 crosses over and begins to go negative during its second half cycle and conduction is transferred to the second transistor 12, the output voltage 44 will still remain at zero since transistor 12 cannot begin to conduct, and thus will have zero output, until the "diode drop" voltage $-V_{BE_{12}}$ across its base-emitter junction is exceeded by the negative going input signal applied to its base. When this finally happens, the output voltage will then follow the input voltage as shown until the input signals once more starts to cross over from negative to positive polarity at which point the above described process is repeated again.

It is evident from FIG. 2A, that in the absence of a suitable biasing arrangement adapted to maintain the operation of transistors 10 and 12 consistently above the basic "diode drops" across their respective base-emitter junctions, severe "crossover distortion" results in the output waveform 44, which distortion is particularly magnified at low input signal levels. Thus for example, in the prior art circuit of FIG. 1 the biasing function is accomplished by providing a voltage divider circuit 26 comprising the four resistors 32 thru 38 arranged as shown. The effect of the voltage divider is to apply a voltage drop across the corresponding base of each transistor sufficient to overcome is base-emitter "diode drop" or in other words to cause a small bias current to flow into the base of transistor 10 and out from the base of transistor 12. Unfortunately, however, this also causes a quiescent current to always flow through the two collector-emitter paths in series between the voltage supply lines 16 and 20. And as mentioned above, the quiescent current renders a transistor circuit of the likes of that shown in FIG. 1 extremely vulnerable to "thermal runaway" in the event of changes in ambient temperatures.

In order to overcome the disadvantages inhering to the prior art method of biasing complementary paired, emitter-follower transistor circuits a novel biasing technique is contemplated herein in accordance with the present invention as will now be described in connection with FIG. 3.

Figure 3:
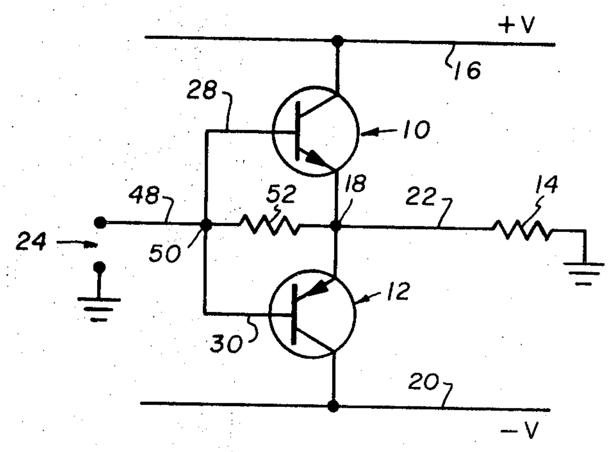
FIG. 3 is a schematic circuit diagram showing the circuit in accordance with the principles of the present invention.

As in the circuit of FIG. 1, the circuit of FIG. 3 includes a pair of complementary transistors 10 and 12 arranged as emitter-followers for delivering amplifier current through a load resistor 14. Thus, transistor 10 which is an NPN type transistor has its collector terminal connected to a positive voltage supply line 16 and its emitter terminal connected to a common junction 18. Transistor 12 on the other hand which is of the PNP type also has its emitter terminal connected to common junction 18 and has its collector terminal connected to a negative voltage supply line 20. A conductor 22 connects the common emitter junction 18 to the load resistor 14. Input terminal 24 is connected by a conductor 48 to an input junction 50 which, in turn, is connected to a pair of branch conductors 28 and 30 leading to the bases of the respective transistors 10 and 12. An impedance network which may comprise a single resistance 52 as shown in FIG. 3 is connected directly between the input junction 50 and the common emitter junction 18. The impedance network or resistor 52 is thus connected in series with the input terminal 24, conductor 48, conductor 22, and load resistor 14. It is also connected in parallel with the two base-emitter circuit paths corresponding respectively to transistors 10 and 12.

In the absence of resistor 52, the circuit of FIG. 3 is identical to the circuit of FIG. 1 wherein the resistors 34 and 36 are short circuited and the resistors 32 and 38 are replaced by open circuits as was discussed previously in connection with FIG. 2A.

Generally speaking, the resistor 52 eliminates the "zero gain" region in such circuits by directly coupling the input signal to the output resistor when the input signal magnitude is less than the "diode drop" of the base-emitter junction corresponding to either transistor. At higher input signal levels, that is greater than the "diode drop" of each transistor—about 0.3 volts for germanium transistors and about 0.7 volts for silicon transistors—the resistor 52 functions to drive one transistor into conduction and to maintain the other cutoff depending upon the polarity of the input signal.

Figure 2B:
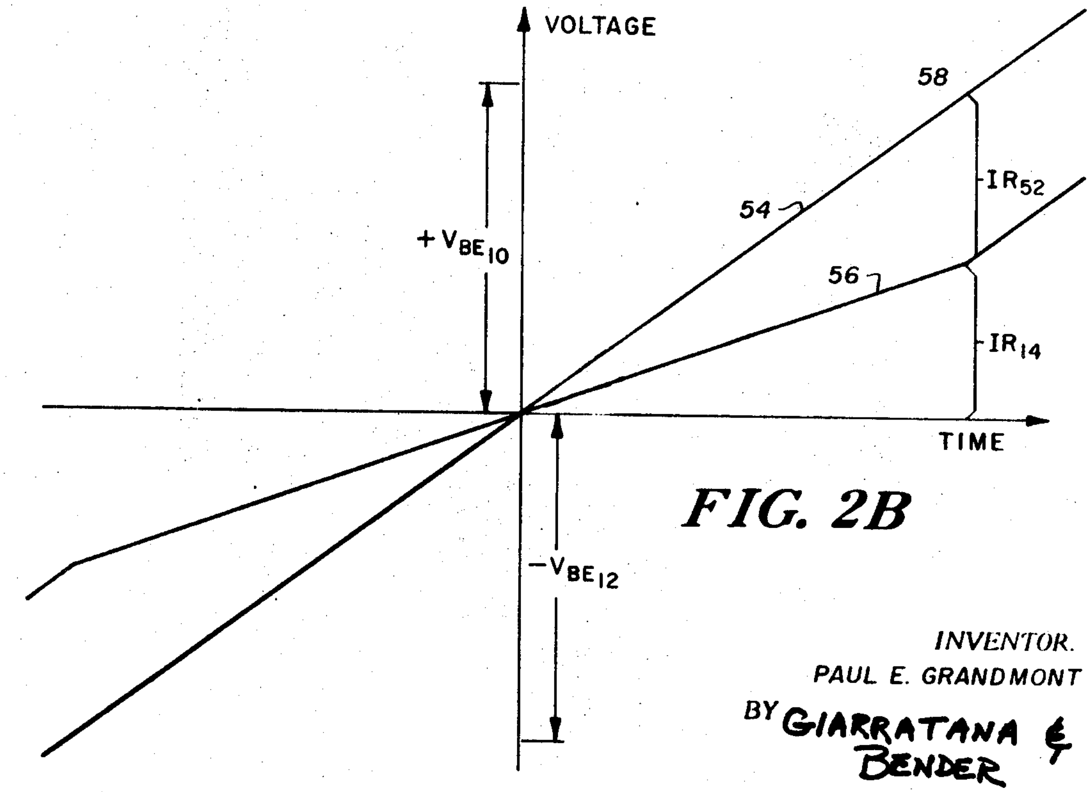

To illustrate further, consider the operation of the circuit of FIG. 3 when a sinusoidally varying input signal is applied to the input terminals 24 as will now be described with the aid of FIG. 2B. As indicated in FIG. 2B, the input signal voltage 54 will begin to rise from zero in the positive direction while each of the transistors 10 and 12 remains cut off due to the back bias across their respective base-emitter junctions. However, since the resistor 52 now series couples the input directly to the load resistor 14, the rising input voltage at junction 50 will cause current to flow through the resistor 52, conductor 22 and load resistor 14. Accordingly, a rising output voltage characteristic 56 will be developed across the load resistor despite the fact that the transistor 10 has not yet been driven into conduction. Inasmuch as the voltage at terminal 50 is now divided between resistors 52 and 14, the output voltage across resistor 14 will be attenuated slightly by the IR drop across resistor 52. Nonetheless the voltage gain of the circuit in the low signal range is no longer zero when the input signal is less than $+V_{BE_{10}}$ or greater than $-V_{BE_{12}}$, for example, but may now be given by the ratio $$\frac{R_L}{R_c+R_L} \qquad (1)$$

where $R_c$ is equal to the ohmic value of resistor 52 and $R_L$ is equal to the ohmic value of load resistor 14. From expression (1), it is apparent that the slope of the output voltage characteristic 56 in this range may be made greater by decreasing the value of $R_c$ relative to $R_L$ with an optimum characteristic being obtained when $$R_c=\frac{V_{BE}}{I_{i\ max}} \qquad (2)$$

where $I_{i\ max}$ represents maximum source current, and $V_{BE}$ is equal to the base emitter junction or threshold voltage of either transistor 10 or 12. It is thus seen that the provision of the single resistor 52 in accordance with the present invention substantially eliminates the "zero gain" or "dead" cross-over region previously discussed in connection with FIG. 2A.

Now as the magnitude of the positive input voltage continues to rise and finally reaches a value equal to $+V_{BE_{10}}$ as indicated in FIG. 2B by reference numeral 58, the base emitter junction of transistor 10 begins to draw current from the input source and the latter transistor is finally driven into conduction. At the same time, because of the polarity of the voltage drop across resistor 52, the base of transistor 12 will be even more positive than previously and will accordingly be maintained at cutoff. An amplified multiple of current thus flows from the voltage supply line 16 through the collector-emitter circuit of transistor 10 and into the load resistor 14 via terminal 18 and conductor 22. This in turn, causes the voltage to rise at the load emitter junction 18 which then causes a corresponding rise in impedance as seen from the input side. Thus, although the current flowing into the base of transistor 10 continues to rise, the increase in impedance reflected back to the input maintains the voltage difference between terminal 50 and terminal 18 essentially constant and equal to the IR drop across resistor 52 as input and output both rise. This continues until the input signal passes through its maximum and begins to go less positive. The voltage at junction 18 decreases with decreasing current flow into the base of transistor 10 and when the latter reaches cutoff, the input signal is once more directly coupled to the load resistor and delivers current therethrough in accordance with expression (1). Then as the input signal "crosses over" changing from its positive half cycle to its negative half cycle the above described process takes place in reverse. That is, the voltage at junction 50 starts to go negative and current is delivered from the load resistor 14 through resistor 52 to the input source until the input potential exceeds the negative back bias of the base-emitter junction corresponding to transistor 12. With transistor 12 now driven into conduction and transistor 10 cut off due to the negative voltage polarity at terminal 50, amplified current begins to flow from the load resistor through conductor 22, and through the emitter-collector circuit of the transistor 12 to the negative voltage supply line 20 and in direct proportion to the increase in negative potential of the input signal.

It will thus be appreciated that the relatively simple biasing circuit of FIG. 3 wherein a single resistance is connected in parallel between the base-emitter paths of a complementary pair of transistors 10 and 12, retains the principal advantages of the prior art biasing circuit which latter uses at least four times as many circuit elements. What is more, the circuit of FIG. 3 has the further advantage of eliminating all quiescent currents when both transistors are cut off; hence, this circuit is completely stable despite changes in ambient temperature.

Figure 4A:
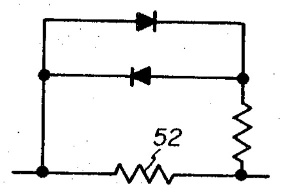
FIGS. 4A thru 4C are circuit diagrams showing alternate preferred embodiments of the circuit of FIG. 3.
Figure 4B:
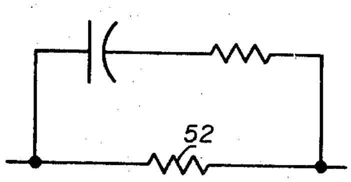
Figure 4C:
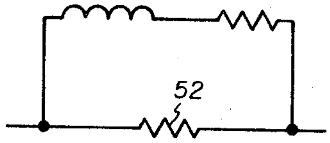

And, although a preferred embodiment of the invention has been disclosed herein as required by statute, it is anticipated that various modifications and alterations therein may be carried out without departing from the scope of the invention. For example, it might be desirable to use the more complex impedance network as shown in FIGS. 4A, 4B and 4C in lieu of the single resistance 52 shown in FIG. 3. In FIG. 4A, the impedance network comprises a resistor and a pair of diodes shunted across the resistor 52, the purpose of the diodes and resistor being to controllably limit the amount of base current flowing into each respective transistor in the event of an output short circuit. The resistor 52 could also be shunted by a resistor-capacitor branch as indicated in FIG. 4B to vary the effective value of the impedance network with frequency, as would also be done by the alternate embodiment of FIG. 4C, wherein an inductor is provided rather than a capacitor for "-biasing-on" the output transistors more strongly of rapid changes of input voltage at higher frequencies.

Another desirable modification may be preferred where it is desirous to limit the fractional gain given by expression (1) when the amplifier stage is operating below cutoff. This may be done by combining the base-emitter resistor 52 of FIG. 3 to the prior art biasing scheme shown in FIG. 1, in which case the resistor 52 will be connected between the load emitter terminal 18 and the terminal junction between resistors 34 and 36 as indicated by the dashed lines in FIG. 1. The values of the different resistors may then be adjusted to provide a preferred voltage level between input terminals 24 and the base of either transistor 10 or 12, up to and including the "diode drop" value of the two transistors respectively. In fact, by using different values for resistors 34 and 36, the bias voltages resulting when the resistor 52 is added may be used to provide different "bias voltages" for a circuit comprising, say, one NPN germanium transistor and one PNP silicon transistor or vice versa.

Figure 5:
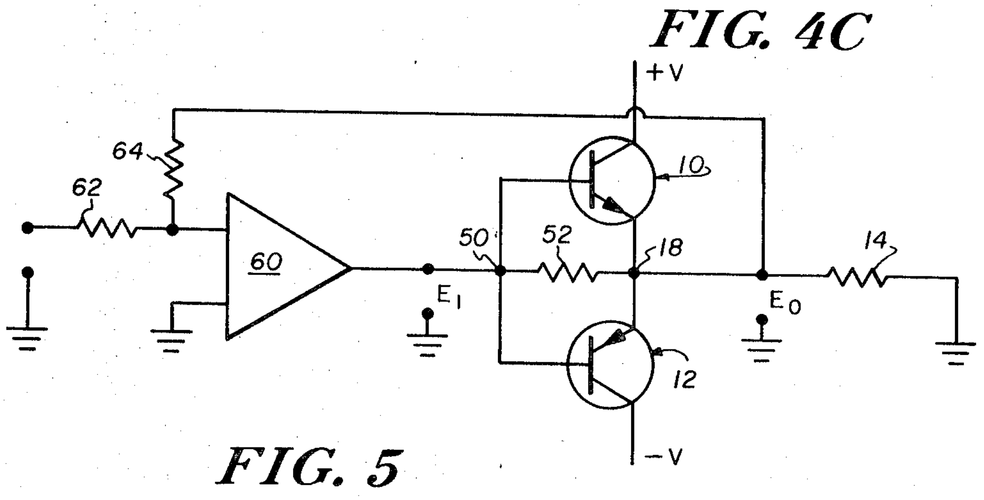
FIG. 5 is a circuit diagram illustrating the use of the circuit of FIG. 3 in conjunction with an operational feedback amplifier.

Finally, it is to be noted that the biasing scheme of the present invention renders the amplifier stage of FIG. 3 particularly well suited for use as a current booster with conventional operational amplifiers; that is, where it is preferable to increase the output current capabilities of an "opamp." For example, reference is now made to FIG. 5 wherein the circuit of FIG. 3 is shown connected in the feedback loop of an operational amplifier 60. The latter has an input resistor 62 and an output terminal $E_1$ connected directly to terminal 50 of the circuit of FIG. 3. Feedback is taken from the output terminal 18 and applied to the input of the amplifier through resistor 64.

Consider now the operation of this circuit when terminals 50 and 18 are at the same potential (i.e., both transistors 10 and 12 cutoff with zero quiescent current) and with resistor 52 open circuited. Under these conditions, the feedback loop through resistor 64 will also be open circuited and as a result the operational amplifier will generally show an abnormally large "offset voltage" at its output terminals $E_1$ which will generally be of such magnitude and polarity as to turn on the correct transistor for providing a feedback voltage ($E_O$) of sufficient magnitude and polarity to maintain the offset. Now, it can readily be seen that if the opamp's "offset" were to fluctuate in terms of its polarity, the transistors 10 and 12 would have to be "slammed" on and off accordingly, and the danger would arise of driving the amplifier into a condition of instability and/or oscillation.

The above may be completely overcome, however, by connecting resistor 52 between terminals 50 and 18 in accordance with the present invention as previously described, for example, in connection with FIG. 3. When this is done, any "offset voltage" signals which are insufficient to bias either of the transistors 10 or 12 into conduction, will be connected directly to the load resistor through resistor 52 thereby eliminating the open-loop condition when resistor 52 was open circuited. In other words, the feedback loop will always be closed for even low level "offset" signals appearing at $E_1$ and thereby prevent such offsets from becoming abnormally large. Then when the amplifier 60 is driven to produce larger output currents, the rising voltage drop across resistor 52 will cause the proper transistor to conduct thereby boosting the current through load resistor 14. In identically the same manner described above, this will, in turn, raise the load impedance seen by the opamp's output and maintain the difference between the feedback voltage $E_O$ and the opamp output voltage $E_1$ constant and equal to the voltage drop of across resistor 52 throughout the normal light load range of $E_1$, all of the while permitting heavy current to flow through resistor 14. For example, by using a conventional opamp with the circuit of FIG. 3 as shown, it has been found that current boost of up to 10 times rated output may be achieved through the load resistor 14. This is in addition to overcoming the oscillatory problems associated with the open-loop condition referred to above.

I claim:

1. An electrical circuit arrangement comprising;
- a pair of voltage supply terminals of opposite polarity,
- a pair of complementary transistors connected in series between said voltage supply lines wherein the collector terminals corresponding to said transistors are respectively connected to one of said voltage supply terminals and the emitter terminals of said transistors are connected to each other at a common junction,
- a load impedance connected in series with said common emitter junction,
- an input terminal commonly connected to the base of each said transistor, and
- an impedance network connected in series between said common base input terminal and said common emitter junction, wherein said impedance network comprises a resistor shunted by a pair of oppositely biased diodes.

2. An electrical circuit according to claim 1 further comprising:
- an operational amplifier having an input and being connected to said common base input terminal in series with said impedance network, and a feedback loop connected between said output load impedance and the input to said operational amplifier.

3. An electrical circuit arrangement comprising;
- a pair of voltage supply terminals of opposite polarity,
- a pair of complementary transistors connected in series between said voltage supply lines wherein the collector terminals corresponding to said transistors are respectively connected to one of said voltage supply terminals and the emitter terminals of said transistors are connected to each other at a common junction,
- a load impedance connected in series with said common emitter junction,
- an input terminal commonly connected to the base of each said transistor, and
- an impedance network connected in series between said common base input terminal and said common emitter junction, wherein said impedance network comprises a resistor shunted by a circuit path having a resistor and a reactive impedance connected in series.